(12) United States Patent
Dhong et al.

(10) Patent No.: US 6,285,218 B1
(45) Date of Patent: Sep. 4, 2001

(54) METHOD AND APPARATUS FOR IMPLEMENTING LOGIC USING MASK-PROGRAMMABLE DYNAMIC LOGIC GATES

(75) Inventors: Sang Hoo Dhong; Hung Cai Ngo, both of Austin, TX (US); Jaehong Park, Kyunggi-Do (KR); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/567,381

(22) Filed: May 10, 2000

(51) Int. Cl.[7] .................................................. H03K 19/094
(52) U.S. Cl. ............................. 326/112; 326/37; 326/49; 326/42
(58) Field of Search .................................. 326/37, 38, 39, 326/44, 49, 50, 101, 102, 112, 119, 121

(56) References Cited

U.S. PATENT DOCUMENTS

| | | | |
|---|---|---|---|
| 4,892,840 | * | 1/1990 | Esquivel et al. .................... 437/52 |
| 5,471,154 | * | 11/1995 | Gordon et al. ..................... 326/38 |
| 5,670,898 | * | 9/1997 | Fang .................................. 326/93 |

* cited by examiner

Primary Examiner—Michael Tokar
Assistant Examiner—Don Phu Le
(74) Attorney, Agent, or Firm—Casimer K. Salys; Bracewell & Patterson, L.L.P.

(57) ABSTRACT

A method and apparatus for implementing dynamic logic with programmable dynamic logic gates acts as a complement to programmable logic arrays (PLAs) used in high-speed microprocessor designs. A matrix of selectable cells provides powerful logic functions such as AND-OR gate capability with a minimum of inputs and transistors. By using programmable logic arrays and programmable dynamic gates, the efficiency of a logic block can be dramatically improved with little added circuit area.

20 Claims, 6 Drawing Sheets

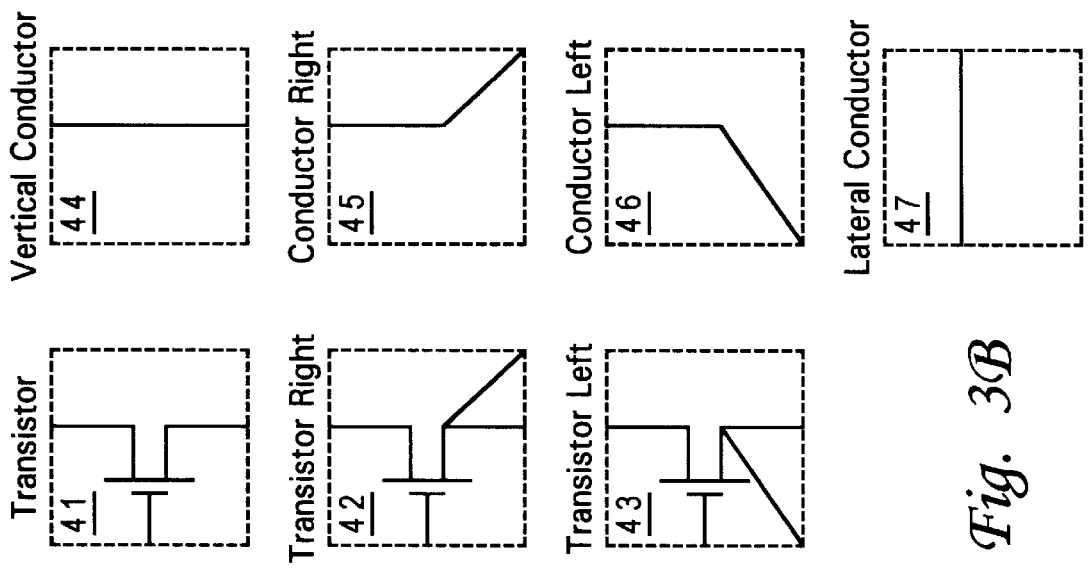
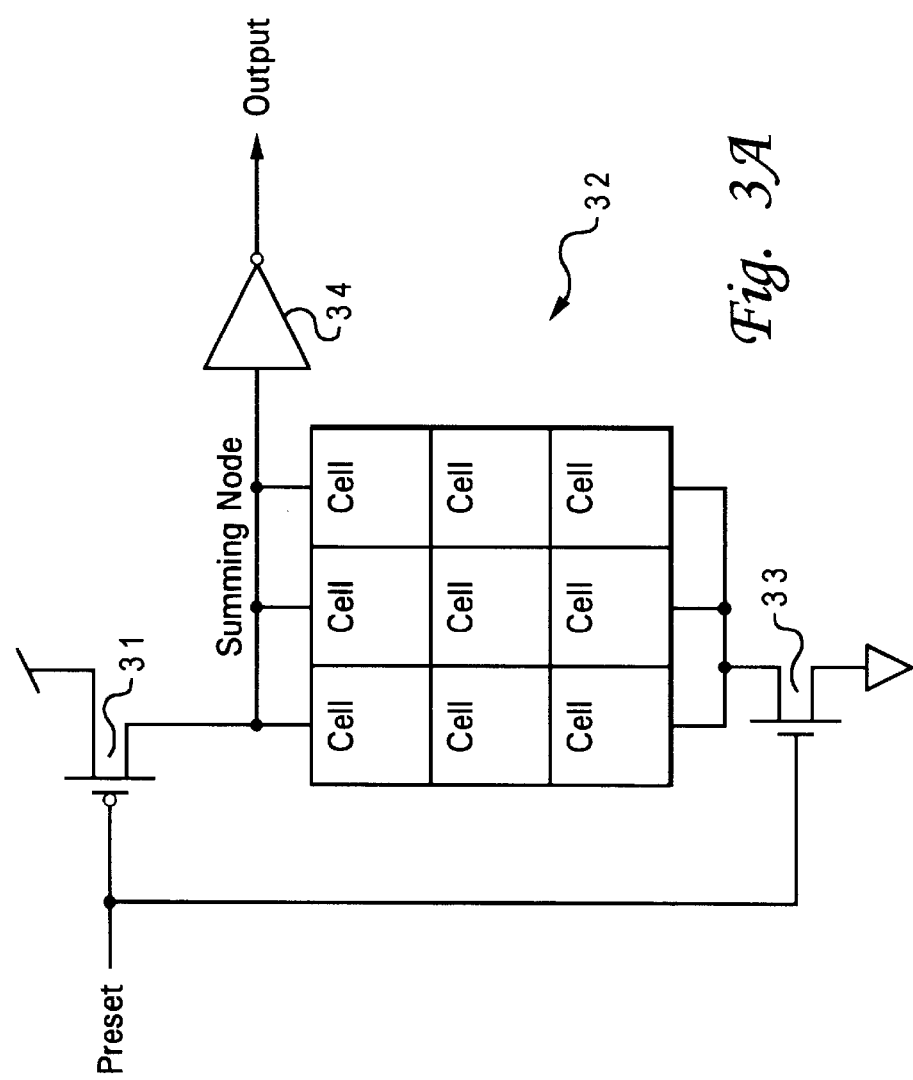
Fig. 3B
Fig. 3A

METHOD AND APPARATUS FOR IMPLEMENTING LOGIC USING MASK-PROGRAMMABLE DYNAMIC LOGIC GATES

BACKGROUND OF THE INVENTION

1. Technical Field

The present invention relates in general to programmable logic circuits, and in particular, to dynamic programmable logic gates using mask-programmable logic cells.

2. Description of the Related Art

Logic circuits, particularly those used to simultaneously evaluate an equation with a large number of inputs have been implemented in a variety of architectures. A programmable logic array (PLA) is an integrated circuit device that incorporates fixed sets of AND and OR logic gates or similar functions such as NAND, NOR, XOR or XNOR with one or more interconnect planes used to create several logical combinatorial outputs from several logical inputs. The interconnect planes in a mask PLA are usually metallization layers that can be redesigned and deposited during a production run without redesigning the semiconductor layers of the device. The depositing of the mask can be performed by vapor deposition of aluminum or other metals using techniques well known in the art. The mask connects devices within an interconnect array or "plane" comprising two sets of conductors, a set of logic inputs and a set of logic gate inputs. The sets of conductors are coupled together with devices that create a logic contribution from the logic inputs to the logic gate inputs. Fuse PLAs allow programming of the device after manufacture by using a programming unit or appropriate in-circuit electronics to allow programming of the device.

PLAs have found use in complex logic network implementations and recently in high-speed microprocessor core designs where they can be used to implement the state machines and control logic of the processor. A disadvantage associated with the use of PLAs is associated with the organization of their logic. Due to the sum-of-products or product-of-sums arrangement, implementation of complex logic functions may not be efficient. An input might only be used in a very limited sense, for example within only one midterm in the entire logic array. The number of maxterms may be limited in the interconnect between the input plane and the output plane, making some logic equation implementations too complex for a particular PLA. These limitations are usually overcome by adding additional static or dynamic gates to implement the additional logic required, but this arrangement is non-programmable and loses the benefits of quick mask turn-around and the structured design available with programmable logic.

Therefore, it would be desirable to implement programmable logic in such a way as to improve the efficiency of logic implementations and additionally, to facilitate the use of PLAs in logic designs.

SUMMARY OF THE INVENTION

The objectives of improving the efficiency of programmable logic and facilitating the use of PLAs in logic designs are accomplished in dynamic programmable logic gate having a pre-charge device for charging a summing node and a cell matrix coupled to the summing node for receiving multiple logic inputs. The cell matrix has rows and columns for accepting cells selected that hold either a conductor or a transistor. The transistors connected in the matrix are coupled to one of the logic inputs. The transistor and conductor cells are designed so that they may couple to a next lower cell within the matrix, and optionally to the a next lower cell in an adjacent column. The objectives are also achieved in methods for fabricating and operating the dynamic programmable logic gate described above.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein

FIG. 3A is a schematic diagram of a programmable dynamic logic gate in accordance with an embodiment of the present invention, FIG. 3B is a pictorial diagram depicting cells that may be used with the programmable dynamic logic gate of FIG. 3A;

DETAILED DESCRIPTION OF PREFERRED EMBODIMENT

Figure 1:
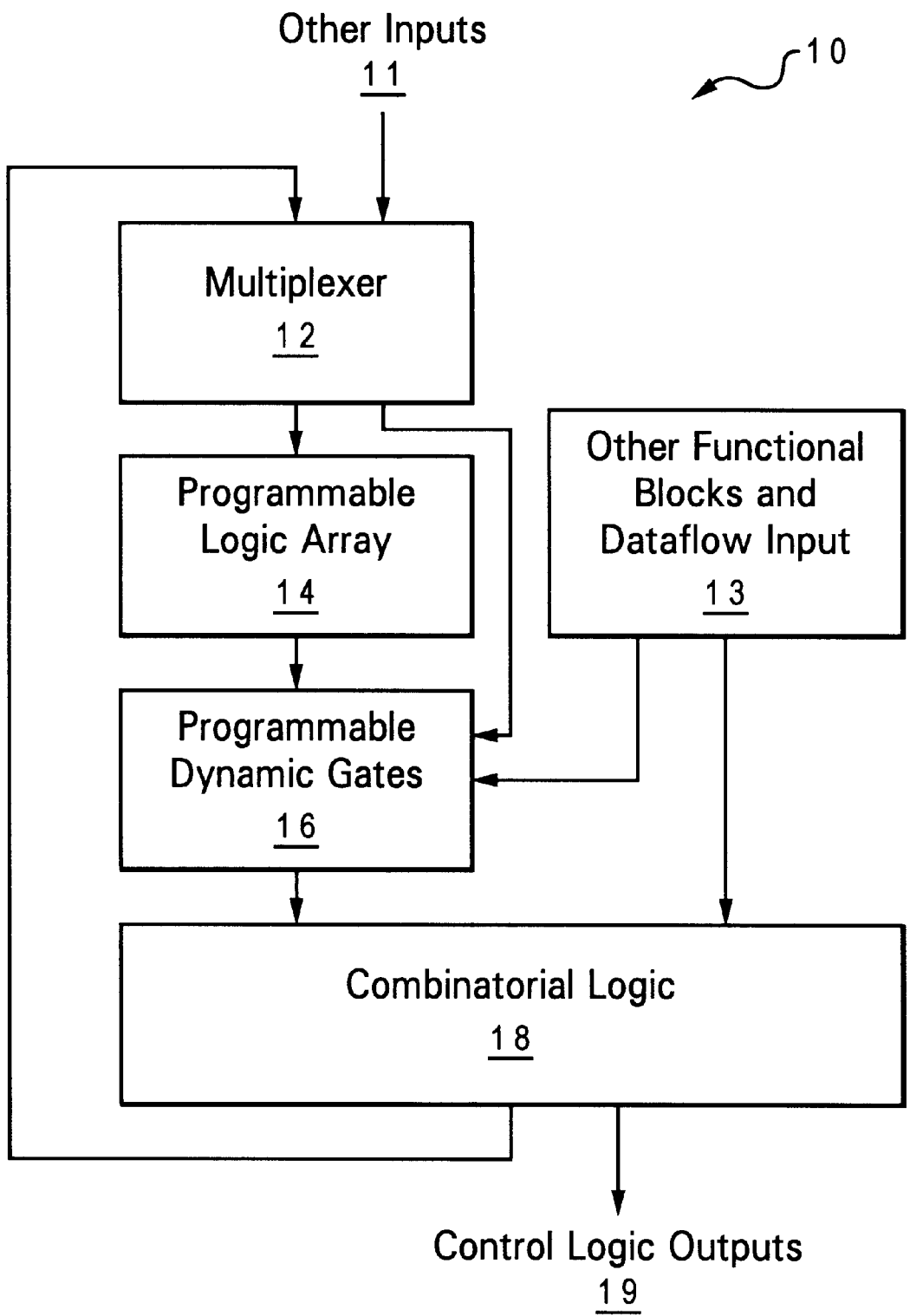
FIG. 1 is a block diagram depicting a microprocessor logic core in which an embodiment of the present invention may be used.

With reference now to the figures and in particular with reference to FIG. 1, there is depicted a control logic block 10 for a microprocessor that includes programmable dynamic gates 16 in accordance with an embodiment of the present invention. A multiplexer 12 selects an output of combinatorial logic 18, or other inputs 11 to provide a next-state input to a programmable logic array 14. The output of programmable logic array 14 is connected to programmable dynamic gates 16, and the output of programmable dynamic gates 16 are provided to the inputs of combinatorial logic 18 which provides control logic outputs 19 for the microprocessor block. Other inputs are provided to programmable logic gates 16 from other functional blocks and dataflow input 13 and multiplexer 12, so that operation of the logic may be dependent on these inputs without overly complicating the programmable logic array 14. Without programmable dynamic gates 16, programmable logic array 14 may not be able to efficiently implement the logic required by control logic block 10.

Figure 2:
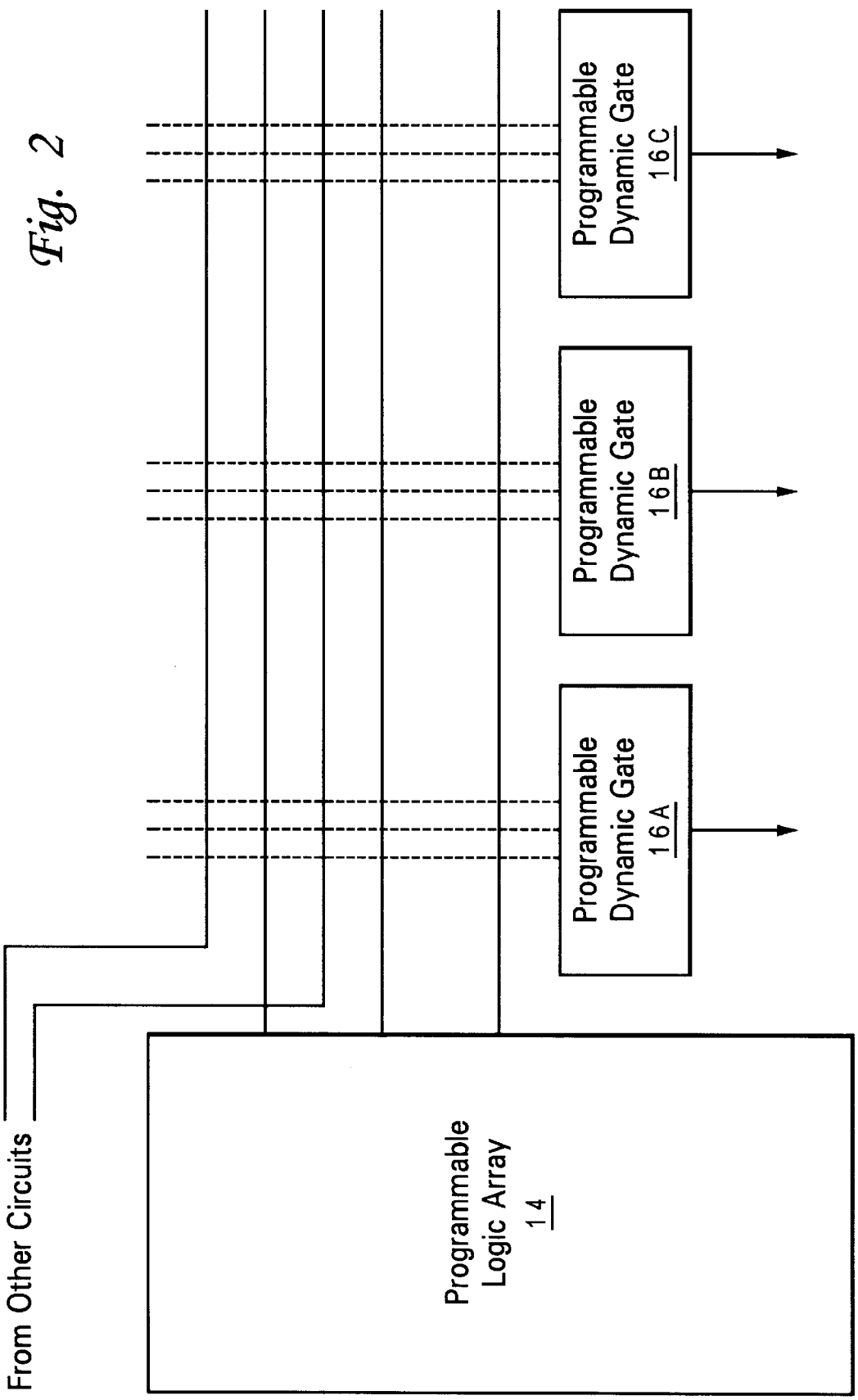
FIG. 2 is a block diagram of interconnections between programmable logic arrays and programmable dynamic gates of the microprocessor logic core of FIG. 1 in accordance with an embodiment of the present invention.

Referring now to FIG. 2, the interconnection of outputs from programmable logic array 14 and programmable dynamic gates 16A–16C is shown. Each of the outputs of programmable logic array 14 can be selectively coupled to inputs of programmable dynamic gates 16A–16C. This allows flexibility in logic implementation and efficiency, as a dedicated input does not have to be provided for each of the outputs of programmable logic array 14, as would be the case with an implementation of a complete plane within a programmable logic array. In addition, external inputs can be coupled, so that, for example, if one of the outputs programmable logic array 14 must be gated with a signal, the programmable dynamic gate can perform this function, rather than dedicating an input of programmable logic array 14 to perform this function.

Referring now to FIG. 3A, the implementation of programmable logic gates 16A–16C is shown. A precharge device 31, is coupled to a summing node to pre-set the summing node in response to a preset input. Cell matrix 32 is provided to discharge the summing node for particular combinations of logic inputs. A foot device 33 disconnects the bottom of cell matrix 32 from ground when preset is pre-charging the summing node. An inverter 34 is provided to invert the state of the summing node to provide a logic output. A buffer could similarly be used in this location.

Referring now to FIG. 3B, a set of cells is depicted. These cells may be connected in cell matrix 32 to provide a variety of logic functions. Cell 41 is an N-channel Metal Oxide (NMOS) transistor that will couple the top connection of cell 41 to the next lower cell in the matrix column in which cell 41 is inserted. If the logic input coupled to cell 41 is in a logic high state, the connection at the top of cell 41 will be pulled low if the next lower cell in the column is held at a logic low state. Cell 42 is an NMOS transistor which operates similarly to cell 41, except that the lower cell to the right in the matrix provides a current sink. Similarly, cell 43 provides a connection to the next lower cell to the left. Cells 44–47 are conductor cells. These cells add no logical contributions in and of themselves, but cells 44–46 connect the top of to a next lower cell. Vertical conductor cell 44 connects the top of cell 44 to the cell directly beneath. Conductor right cell 45 connects the top of cell 45 to the next lower cell to the right and conductor left cell 46 connects the top of cell 46 to the next lower cell to the left. Lateral conductor cell 47 couples two cells laterally so that a column may be skipped.

Figure 4:
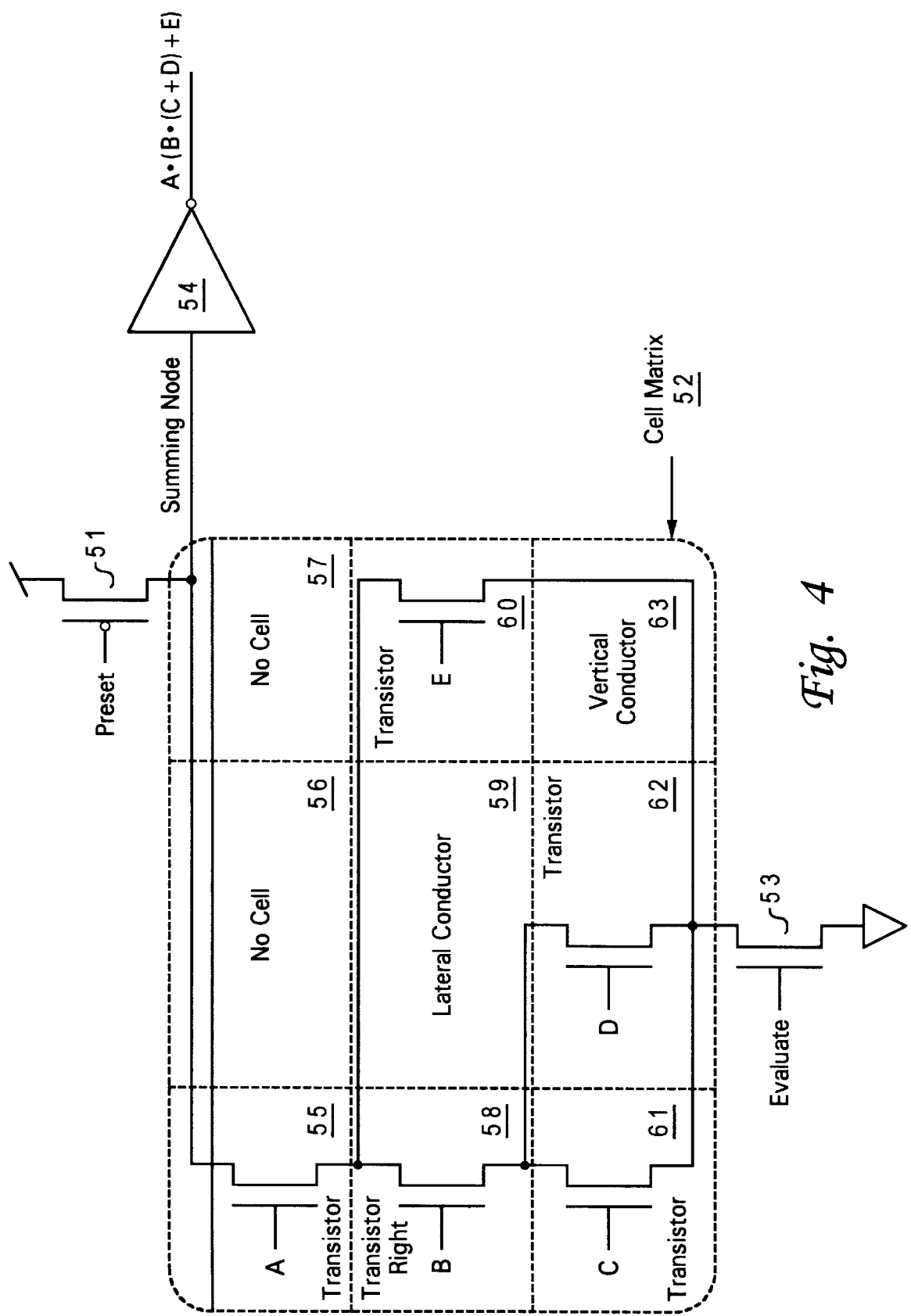
FIG. 4 is a schematic diagram depicting an implementation of a dynamic programmable logic gate.

Referring now to FIG. 4, a particular electrical configuration of a programmable dynamic gate is shown. A precharge device 51 pre-charges the summing node to a high logic level when a preset input is at a low logic level. A foot device 53 disconnects a cell matrix 52 when an evaluate signal is at a low level (this may be the preset signal), preventing discharge of the summing node through cell matrix 52. Cell matrix 52 has cells 56 and 57 unpopulated. Cell 55 has a transistor cell, causing an AND contribution for input A to the logic equation governing the output of inverter 54 (cell 55 must be activated by input A for the summing node to be discharged by cell matrix 52). Cell 59 has a lateral conductor cell, coupling transistor cell 60 in parallel with transistor right cell 58. This creates an OR contribution for the path formed by cells 60 and 63, and the path formed by cells 58, 61 and 62 (one of these paths must be conducting for the summing node to be discharged by cell matrix 52). Cell 63 is a vertical conductor cell, coupling the bottom of cell 60 to ground, therefore input E has an OR contribution at the top of the second row of cells. Cell 58 has an OR contribution for input B which is combined in a logical AND with a path formed by cells 61 and 62. Cells 61 and 62 are transistor cells, causing another OR contribution with respect to the path formed by cells 58, 61, and 62, for inputs C and D coupled to the gates of cells 61 and 62. Thus the logic equation for the output of inverter 54 is A (B (C+D)+E).

Figure 5:
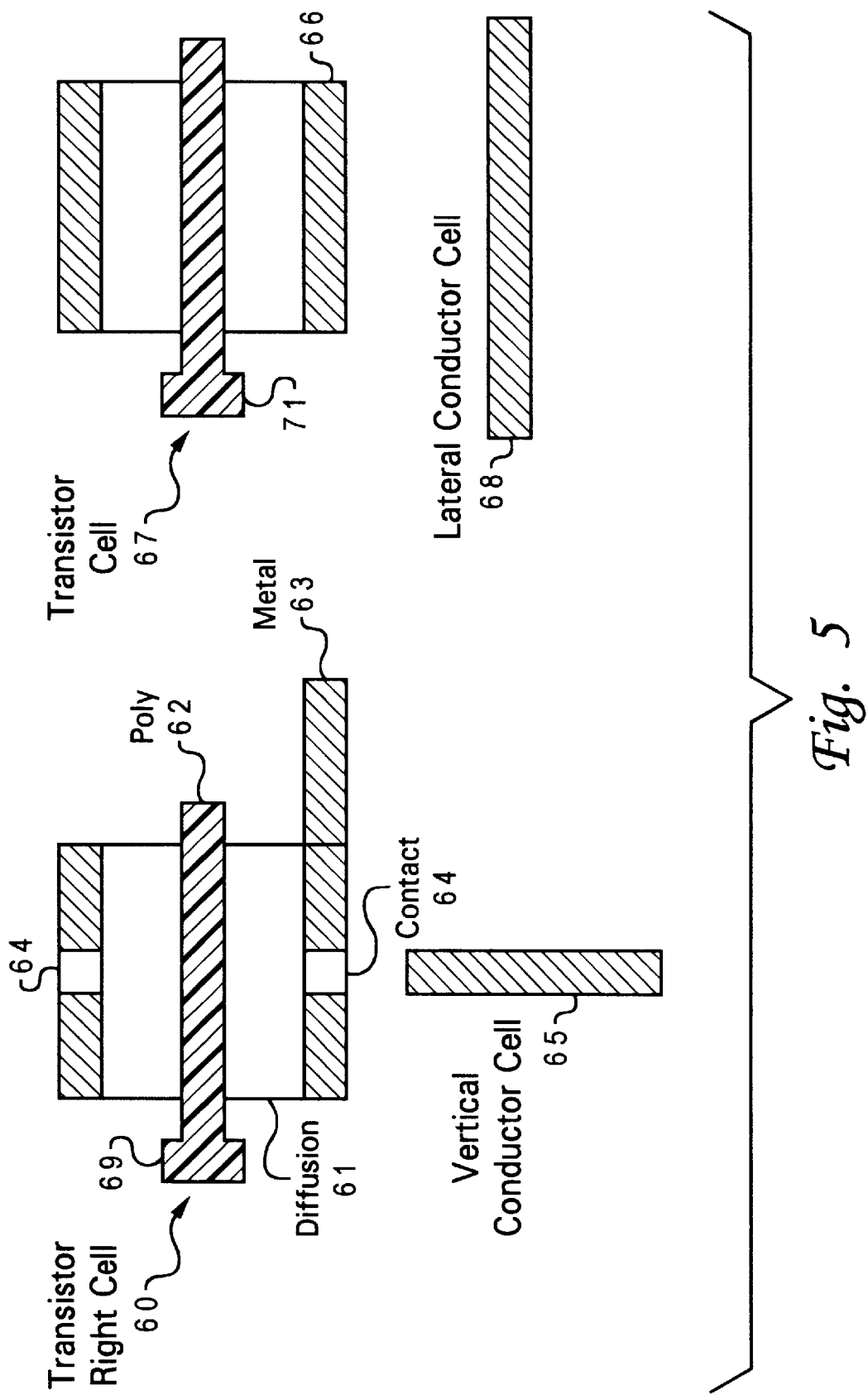
FIG. 5 is a pictorial diagram depicting the structure of cells in accordance an embodiment of the present invention.

Referring now to FIG. 5, the physical structure of cells in accordance with a preferred embodiment of the invention is depicted. In the physical implementation of the programmable dynamic gate, the transistor structures are physically present for all cells, but the implementation of the metal layer governs which cells are actually placed within a given design. This allows for quick turn-around time on design changes and lowers the cost of changing implementations of logic. It also allows for scalability in the sense that semiconductor layers of identical blocks of dynamic gates may placed in many areas of an integrated circuit, and only the metallization layer tailored to implement particular logic functions for a block.

A transistor right cell 60 comprises a diffusion layer 61 and a polysilicon gate 62 underneath a metal gate contact 69. A metal extension 63 is provided to make contact with the next lower cell to the right when this cell is implemented in the cell matrix. To form a vertical conductor cell 65, the metal gate contact 69 is replaced with a vertical conductor at contact positions 64, effectively shorting across the diffusion layer to provide a conductive path between the top of cell 60 and the bottom of cell 60. A transistor cell 67, differs in that no metal extension 63 is provided at the lower conductive contact 66. A lateral conductor cell 68 is made by bridging from the input tab 71 on a cell 67 to the next adjacent cell's input tab 71. A left transistor cell is similar to a right transistor cell, with the metal extension 63 disposed to the left, instead of the right. Similarly, left and right conductor cells can be made with a vertical conductor 65 and a metal extension 63.

Figure 6:
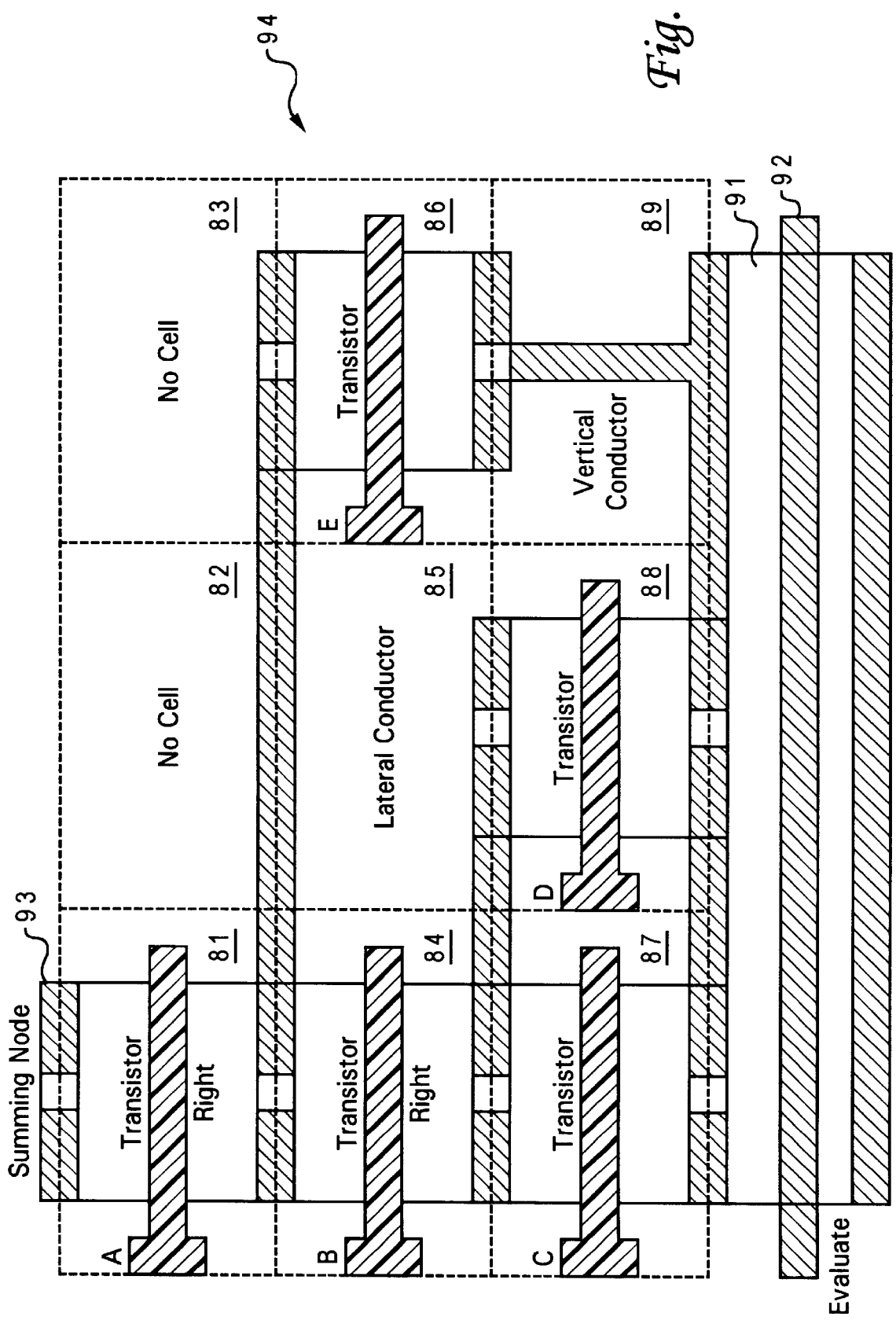
FIG. 6 is a pictorial diagram depicting a physical structure of the dynamic programmable logic gate of FIG. 4.

Referring now to FIG. 6, the physical implementation of the programmable dynamic gate of FIG. 4 is depicted. Cell matrix 94 is coupled to summing node 93 by the metal contact at transistor right cell 81. Input A is coupled to the gate metallization of cell 81. No cells are present at cell locations 82 and 83 so input A must be active for summing node 93 to be discharged. Transistor right cell 84 and transistor cell 86 are coupled in parallel by lateral conductor cell 85. This input B or input E must be active for summing node 93 to be discharged. Transistor cell 86 is coupled to the bottom of cell array 94 by vertical conductor cell 89, while transistor cell 84 is coupled to the bottom of cell array 94 transistor cell 87 in parallel with transistor cell 88. Thus either transistor cell 86 or transistor right cell 84 must be activated to discharge summing node 93, and if only transistor right cell 84 is activated, then one of cell 87 or 88 must be activated to discharge summing node 93. The bottom of cell array 94 is coupled to foot device formed by diffusion layer 91 and controlled by gate 92. The foot device can be made the length of cell array 94 to simplify circuit layout.

While the invention has been particularly shown and described with reference to a preferred embodiment, it will be understood by those skilled in the art that various changes in form and detail may be made therein without departing from the spirit and scope of the invention.

What is claimed is:

1. A dynamic programmable logic gate having a plurality of logic inputs, said dynamic programmable logic gate comprising:

a precharge device for precharging a summing node of said dynamic programmable logic gate; and a cell matrix coupled to said summing node, wherein said cell matrix includes a predetermined number of cells, wherein each of said cells includes a semiconductor device including a channel and a gate, wherein each of said cells can be activated for use in said dynamic programmable logic gate by depositing a metal contact to form either a conductor cell or a transistor cell.

2. The dynamic programmable logic gate of claim 1, further comprising a foot device coupled between said cell matrix and a ground connection.

3. The dynamic programmable logic gate of claim 1, wherein said conductor cell is one of a vertical conductor cell for coupling a top connection of said conductor cell to a next lower cell, a diagonal conductor cell for coupling a top connection of said conductor cell to an adjacent lower cell, or a lateral conductor cell for bridging an adjacent cell.

4. The dynamic programmable logic gate of claim 3, wherein said transistor is one of a direct transistor cell for coupling a top connection of said direct transistor cell to a next lower cell or a diagonal transistor cell for coupling a top connection of said diagonal transistor cell to a next lower cell and an adjacent lower cell.

5. The dynamic programmable logic gate of claim 1, wherein said transistor is one of a direct transistor for coupling a top connection of said direct transistor cell to a next lower cell or a diagonal transistor cell for coupling top connection of said diagonal transistor cell to a next lower cell and an adjacent lower cell.

6. The dynamic programmable logic gate of claim 1, wherein said pre-charge device is a P-channel Metal-Oxide-Semiconductor (MOS) transistor, and wherein said cells comprise N-channel MOS transistors.

7. The dynamic programmable logic gate of claim 6, wherein said metal contacts for forming conductor cells form said conductor cells by shorting said N-channel MOS transistor channels, and said metal contacts for forming transistor cells form said transistor cells by coupling a gate of said N-channel MOS transistor cells to one of said plurality of logic inputs.

8. The dynamic programmable logic gate of claim 1, wherein said metal contacts comprise at least one gate contact for coupling a gate of said transistor cell to one of said plurality of logic inputs.

9. The dynamic programmable logic gate of claim 1, wherein said metal contacts comprise at least one shunt conductor for shorting a channel of said transistor cell.

10. The dynamic programmable logic gate of claim 8, wherein said cells comprise a first cell accepting a first metal contact for forming a transistor cell, and a second cell accepting a second metal contact for forming a conductor cell.

11. A method for fabricating programmable logic using a dynamic programmable logic gate having a plurality of logic inputs, a summing node, and a cell matrix coupled to said summing node, wherein said cell matrix includes semiconductor devices distributed in cells forming rows and columns, wherein said cells are adapted for accepting metal contacts forming one of a conductor cell or a transistor cell, and wherein said method comprises the steps of:

determining whether or not a logic cell is required at a location within said cell matrix;

responsive to determining said logic cell is required, second determining whether or not said logic cell is a conductor cell or a transistor cell;

responsive to determining said logic cell is a conductor cell, depositing a shunt conductor to short a channel of a semiconductor device distributed in said location; and responsive to determining said logic cell is a transistor cell, depositing a gate conductor to couple a gate of said semiconductor device distributed in said location to one of said plurality of logic inputs.

12. The method according to claim 11, wherein said step of depositing a shunt conductor deposits one of a direct cell conductor for coupling a cell to a next lower cell or a diagonal cell conductor for coupling a cell to an adjacent and lower cell.

13. The method according to claim 11, wherein said step of depositing a gate conductor further deposits a conductor for forming a diagonal transistor cell for coupling a top of said logic cell to an adjacent lower cell.

14. The method according to claim 11, further comprising the step of coupling said cell matrix to a foot device for blocking discharge of said summing node while said dynamic programmable logic device is in a non-evaluating state.

15. The method according to claim 11, further comprising the step of coupling a precharge device to said summing node for precharging said summing node.

16. A method of operating programmable logic using a dynamic programmable logic gate having a plurality of logic inputs and a summing node, wherein said method comprises the steps of:

precharging said summing node; and discharging said summing node through a cell matrix coupled to said summing node, wherein said cell matrix includes semiconductor devices distributed in cells forming rows and columns, wherein said cells are adapted for accepting metal contacts forming one of a conductor cell or a transistor cell, and wherein said transistor cell has a gate coupled to one of said plurality of logic inputs.

17. The method according to claim 16, further comprising the step of blocking discharge of said summing node via a foot device until an evaluate indication is received.

18. The method according to claim 16, wherein said step of discharging is performed by passing a current through a conductor, wherein said conductor shorts a semiconductor device that has been adapted to be a conductor cell.

19. The method according to claim 16, wherein said step of discharging is performed by passing a current through a semiconductor device controlled by one of said plurality of logic inputs, wherein said semiconductor device has been adapted to be a transistor cell.

20. The method according to claim 16, wherein said step of discharging is performed by passing a current that is directed from a column to an adjacent column by a conductor that has been deposited for forming a diagonal cell.

* * * * *